United States Patent [19]

Esquivel et al.

[11] Patent Number: 4,833,514
[45] Date of Patent: May 23, 1989

[54] PLANAR FAMOS TRANSISTOR WITH SEALED FLOATING GATE AND DCS+N₂O OXIDE

[75] Inventors: Agerico L. Esquivel, Dallas; Allan T. Mitchell, Garland, both of Tex.

[73] Assignee: Texas Instruments Incorporated, Dallas, Tex.

[21] Appl. No.: 121,980

[22] Filed: Nov. 18, 1987

Related U.S. Application Data

[60] Continuation-in-part of Ser. No. 848,411, Apr. 4, 1986, Pat. No. 4,713,142, which is a division of Ser. No. 4,597,060, May 1, 1985.

[51] Int. Cl.⁴ .................. H01L 29/78; H01L 21/306; B44C 1/22
[52] U.S. Cl. .................. 357/23.5; 156/653; 156/657; 156/662; 357/49; 437/43; 437/52; 437/228
[58] Field of Search ............... 156/643, 646, 653, 655, 156/657, 659.1, 662; 357/23.1, 23.5, 23.6, 41, 45, 49; 437/33, 29, 34, 43–52, 56, 61, 62, 228, 238, 239, 241, 243

[56] References Cited

U.S. PATENT DOCUMENTS 4,598,460 7/1986 Owens et al. .................. 437/52 X
4,713,142 12/1987 Mitchell et al. .................. 156/653

Primary Examiner—William A. Powell
Attorney, Agent, or Firm—Larry C. Schroeder; Leo N. Heiting; Melvin Sharp

[57] ABSTRACT

The invention provides an EPROM having a high quality dielectric to separate the floating gate from low quality dielectric layers used in the prior art by the method outlined as follows. First, the polycrystalline silicon floating gates are formed and partially patterned on the surface of a substrate. A thin thermally grown oxide layer is then formed over the entire array. The source/drain regions are then implanted through the thin silicon dioxide layer into the substrate. Next a thick silicon dioxide layer is deposited by chemical vapor deposition on the surface of the array. The surface of the array is then coated with photoresist which, because of its nature, provides a planarized surface on the top layer of photoresist. The photoresist and the silicon dioxide layer are then etched using an etching process which provides an etching ratio of 1:1 between photoresist and silicon dioxide. The photoresist is completely etched away thus leaving the planarized silicon dioxide surface. The silicon dioxide layer is then further etched so that the top surfaces of the floating gates are exposed. An interlevel insulator layer is then formed on the surface of the array and the active gates are then formed on the surface of the interlevel insulator.

13 Claims, 5 Drawing Sheets

PLANAR FAMOS TRANSISTOR WITH SEALED FLOATING GATE AND DCS+N₂O OXIDE

RELATED APPLICATIONS

This application is a continuation-in-part application of co-pending Application for United States Letters Patent Ser. No. 848,411, filed Apr. 4, 1986, U.S. Pat. No. 4713142, and entitled "EPROM Array and Method For Fabricating", which is a divisional of U.S. Pat. No. 4,597,060, entitled "EPROM Array and Method For Fabricating", Filed 5-1-85.

TECHNICAL FIELD OF THE INVENTION

This invention relates to the field of integrated circuit fabrication. More specifically, this invention relates to the field of electrically programmable read only memory (EPROM) fabrication.

BACKGROUND OF THE INVENTION

An EPROM is a read only memory device in which the stored data may be erased and new data written in its stead. A widely used type of EPROM is a floating gate field effect transistor type. See Sze, *Physics of Semiconductor Devices*, Section 8.61 (1981).

A partial schematic diagram of an EPROM using floating gate field effect transistors is shown in FIG. 1. Memory cells 26-1-1 through 26-2-4 are floating gate field effect transistors. Row decoder 28 provides output signals on row lines 24-1 and 24-2 in response to signals provided on row address input leads 21 and from read/write indicator 23. Column decoder 29 provides and receives signals on column lines 25-1 through 25-5 in response to signals provided on column address input leads 22 and from read/write indicator 23. A memory output signal is provided on output lead 27.

A data bit stored in, for example, memory cell 26-1-1 is read by providing a high voltage output signal on row line 24-1 and providing a low voltage output signal on all other row lines. Column decoder 29 then senses, via column lines 25-1 and 25-2, the impedance of memory cell 26-1-1. If the floating gate of memory cell 26-1-1 contains excess electrons, the negative charge of these excess electrons raises the threshold voltage of memory cell 26-1-1 so that the voltage provided on row line 24-1 is insufficient to cause the channel of memory cell 26-1-1 to conduct. Therefore, column decoder 29 detects a high impedance and provides an appropriate signal on output lead 27. If there are no excess electrons stored on the floating gate on memory cell 26-1-1 then the voltage supplied on row line 24-1 is sufficient to cause memory cell 26-1-1 to conduct. Therefore, column decoder 29 detects a low impedance and provides the appropriate signal on output lead 27.

EPROM 20 is thus programmed by negatively charging the floating gate of selective memory cells. This is accomplished by injecting hot electrons through the insulating layer beneath the floating gate from the substrate of the memory cell.

A problem involved with the fabrication of EPROMs using the techniques in the prior art (see for example McElroy, U.S. Pat. No. 4,151,021, entitled "Method of Making A High Density Floating Gate Electrically Programmable ROM", issued Apr. 24, 1979) occurs during the formation of thick field regions 29 of FIG. 4b of McElroy. These regions are formed in the prior art by thermal oxidation. Thermal oxidation consumes silicon from the substrate laterally as well as vertically. Thus a buffer region must be allowed in the patterning of the oxidation mask for thick oxide regions to provide for this lateral movement of the oxidized region. This buffer region increases the substrate surface area required to fabricate an EPROM using prior art techniques.

Planar technology provides for a small memory cell, which is more reliable. Despite the superior qualities of the planar FAMOS transistor, a programming voltage of 12.5 volts is still necessary for reliable programming. In order to reduce the magnitude of the electric fields created during programming, it is desirable that the programming voltage be reduced.

Therefore, a need has arisen for a planar and non-planar FAMOS technology for use in EPROMs, EEPROMs, EPALs, and other devices using similar memory structures, in which the programming voltage is reduced, and the reliability of the devices increased.

SUMMARY OF THE INVENTION

In accordance with the present invention, non-volatile memory and method of producing the same is provided herein, which substantially eliminates or prevents the disadvantages and problems associated with prior EPROM and EEPROM devices.

First the polycrystalline silicon floating gates and gate oxide layers are formed and partially patterned on the surface of a substrate. A thin thermally grown oxide layer is then formed over the entire array. The source/drain regions are then implanted through the thin silicon dioxide layer into the substrate. Next, a thick silicon dioxide layer is deposited by chemical vapor deposition on the surface of the array. The surface of the array is then coated with photoresists which, because of its nature, provides a planarized surface on the top layer of photoresist. The photoresist and the silicon dioxide layer are then etched using an etching process which provides an etching ratio of 1:1 between photoresist and silicon dioxide. The photoresist is completely etched away thus leaving the planarized silicon dioxide surface. The silicon dioxide layer is then further etched so that the top surfaces of the floating gates are exposed. An interlevel insulator layer is then formed on the surface of the array and the active gates are then formed on the surface of the interlevel insulator.

This aspect of the present invention provides a high quality dielectric, the thin thermally grown oxide, which separates the floating gate from the lower quality dielectric, the CVD silicon dioxide regions. Thus, the present invention has the technical advantage that the floating gate is "sealed" from the lower quality dielectric, and the programmability of the EPROM is greatly enhanced.

In another embodiment of the present invention, a step for forming refractory metal silicide regions in the bit lines of the array is included. The use of silicided bit lines in this type of array is precluded in the prior art because thick field oxide regions must be thermally grown over the silicided regions, using the prior art techniques. The growth of silicon dioxide over silicided regions is very difficult if not impossible.

In yet another embodiment of the present invention, polycrystalline silicon "caps" are included on the top surface of the floating gates. These "caps" provide increased capacitive coupling between the active gates and the floating gates, thereby increasing programming efficiency.

BRIEF DESCRIPTION OF THE DRAWINGS

For a more complete understanding of the present invention and the advantages thereof, reference is now made to the following description now taken in conjunction with the accompanying drawings in which.

DETAILED DESCRIPTION OF THE INVENTION

Figure 1:
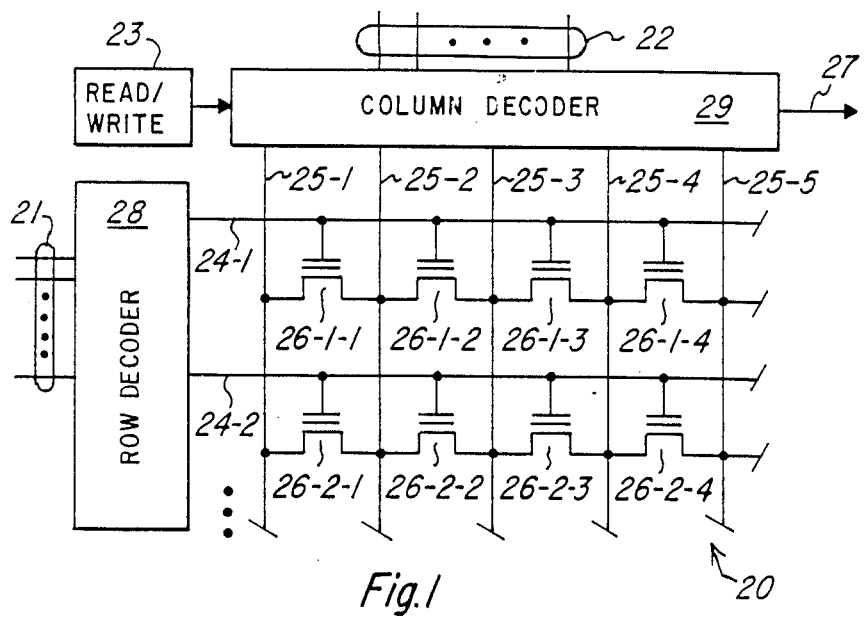
FIG. 1 is a schematic diagram of an EPROM.
Figure 2A:
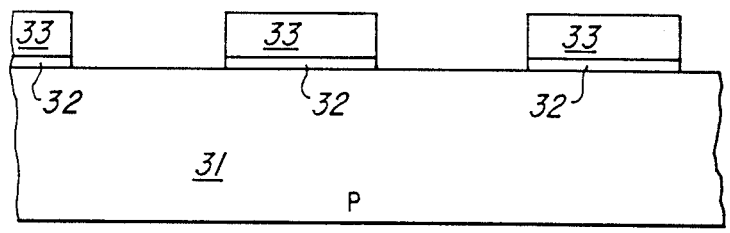
FIGS. 2a-2e are side view schematic diagrams depicting the processing steps of one embodiment of the present invention.
Figure 2B:
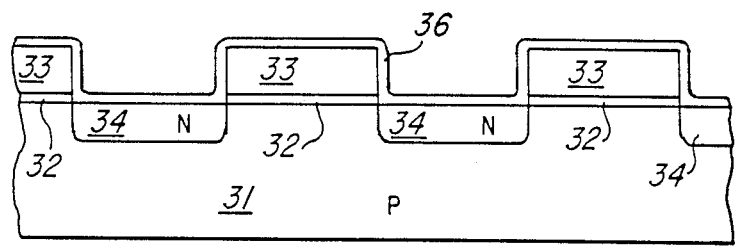
Figure 2C:
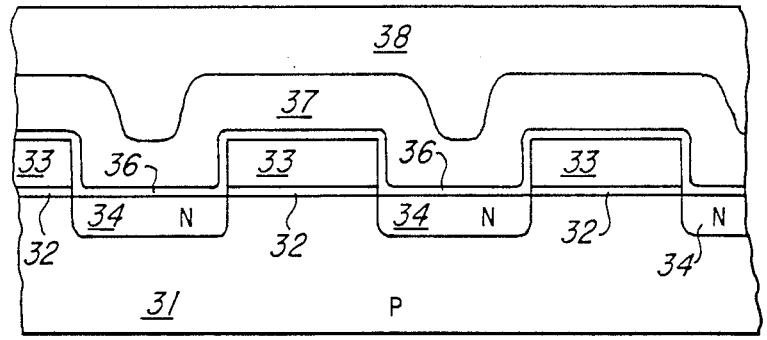
Figure 2D:
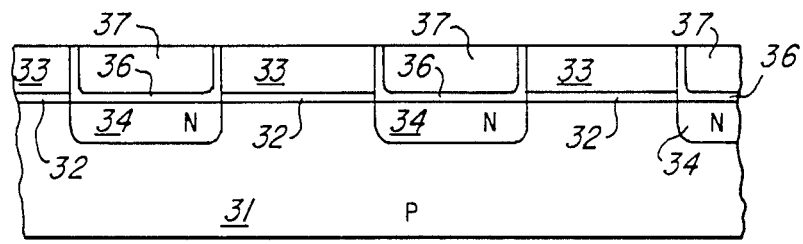

FIGS. 2a-e are side view schematic diagrams depicting the processing steps of one embodiment of the present invention. FIGS 2a-e are taken from a section of an array constructed according to the teachings of this invention. Polycrystalline silicon layer 33 and gate oxide 32 are formed on the surface of substrate 1 using techniques well known in the art to provide the structure shown in FIG. 2a. A high quality dielectric is formed over the structure of FIG. 2a, for example, by subjecting the structure to a thermal oxidation to form silicon dioxide layer 36. Silicon dioxide layer 36 is included as one method for enhancing charge retention and programmability of the floating gate. An ion implantation is then performed of dopant ions, such as arsenic ions having an energy of approximately 150 kiloelectron-volts and a density of approximately 5E15 ions per centimeter squared. This ion implantation is driven-in to form source/drain regions 34 as shown in FIG. 2b. A thick silicon dioxide layer is then formed on the surface of the structure of FIG. 2b by chemical vapor deposition to form silicon dioxide layer 37 as shown in FIG. 2c. On the surface of silicon dioxide layer 37, a layer of photoresist is applied to form photoresist layer 38. Because the photoresist which is used to provide photoresist layer 38 is liquid when applied, the surface of photoresist layer 38 is approximately planar. The structure of FIG. 2c is then subjected to an anisotropic etching process which etches photoresist layer 38 and silicon dioxide layer 37 in an etching ratio of 1:1. The etching rates for various etching facilities varies widely and each facility must adjust its process to provide an etching rate which is approximately 1:1 between photoresist and silicon dioxide; however, a plasma etching process using a $C_2F_6 + CHF_3 + O_2$ plasma has been used to provide this ratio. This etch is continued until the surface of polysilicon layer 33 is exposed. The resulting structure is shown in FIG. 2d.

Figure 2E:
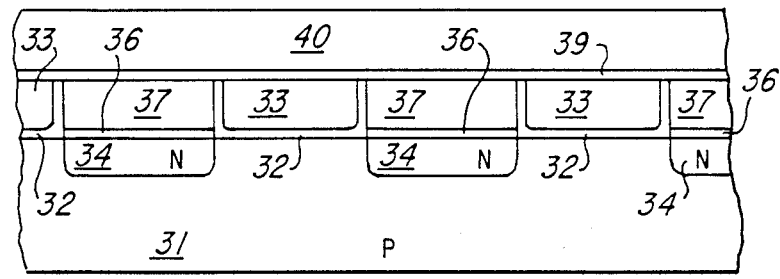

Interlevel dielectric layer 39 is then formed on the surface of the structure of FIG. 2d as shown in FIG. 2e. An active gate material such as polycrystalline silicon layer 40 is then formed on the surface of interlevel insulator layer 39. Polysilicon layer 40 forms the word lines for the EPROM array fabricated using this embodiment of the invention. Of importance, polysilicon layer 40 is planar and is not formed on the sides of polycrystalline silicon layer 33 which is used to form the floating gates of the memory cells of the EPROM array. Because polycrystalline silicon layer 40 is not formed on the sides of polycrystalline layer 33, polycrystalline silicon layer 40 may be completely etched without leaving destructive filaments.

The sealing thermal oxide 36 separates the floating gates 33 from the deposited oxide used in the isolating regions 37. The thermal oxide 36 has superior dielectric characteristics relative to the deposited oxide of the isolating regions 37. Hence, the sealing oxide layer 36 improves the degree of isolation between floating gates 33. The greater degree of isolation improves the programmability of the cells, described hereinbelow.

In an important aspect of the invention, the silicon dioxide layer 37 comprises a DCS (dichlorosilane) $+N_2O$ oxide. The DCS$+N_2O$ oxide (hereinafter "DCS oxide") further increases the programmability of the device, as illustrated in connection with FIGS. 6 and 7

Figure 3A:
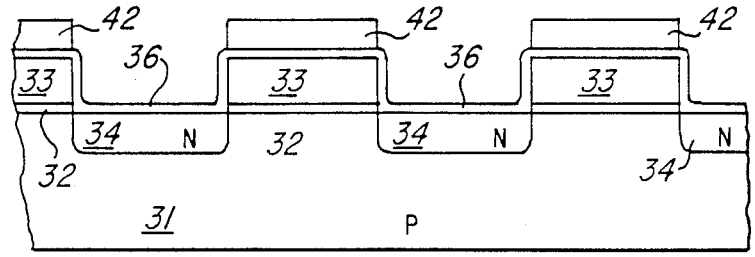
FIGS. 3a-3c are side view schematic drawings depicting another embodiment of the present invention which embodiment include silicide source/drain regions.
Figure 3B:
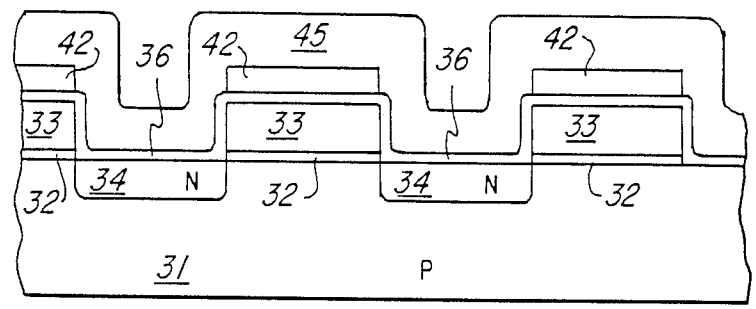
Figure 3C:
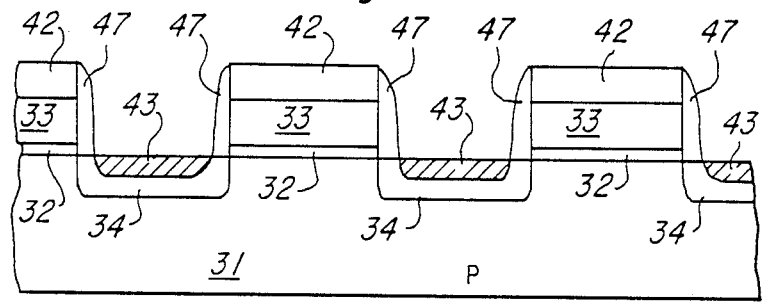

In another embodiment of the present invention, masking layer 42, which is composed of a silicon dioxide layer and a silicon nitride layer, is formed and patterned along with polycrystalline silicon layer 33 as shown in FIG. 3a. Thin oxide layer 36 is then grown by thermal oxidation. The resulting structure is then subjected to an ion implantation as described with regard to FIGS. 2a-2e. This forms source/drain regions 34 as shown in FIG. 3a. (Components having the same identification number in FIGS. 3a-3c as those in FIGS. 2a-2e perform the same function.) Silicon dioxide layer 45 is then formed on the structure of FIG. 3a by chemical vapor deposition as shown in FIG. 3b and then is anisotropically etched back to form sidewall silicon dioxide layers 47 as shown in FIG. 3c. This anisotropic etching process completely removes silicon dioxide layer 45 above source/drain regions 34 but does not remove masking layer 42 on top of polycrystalline silicon gate 33. The structure is then subjected to a contact silicidation process using techniques well known in the art to form refractory metal silicide regions 43 on the surface of source/drain regions 34. These silicide regions lower the sheet resistance of source/drain regions 34 so that source/drain regions 34 may be used as column leads for the EPROM using a minimum number of contact points form the metal column leads (not shown) used to compensate for the higher resistivity of source/drain regions 34. In addition, silicide regions 43 provide better ohmic contact to the metal column leads (not shown) which contact source/drain regions 34. These properties lower the overall column lead a resistance, thus lowering the resistance-capacitance product for circuits including these column leads and thus increasing the speed of the memory array.

Figure 4A:
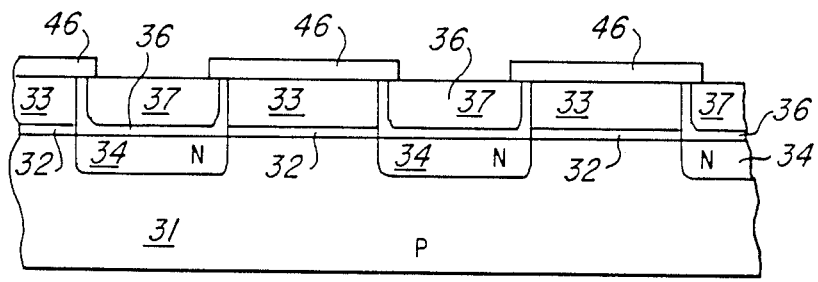
FIGS. 4a-4b are side view schematic diagrams depicting another embodiment of the present invention which includes polycrystalline silicon layers between the floating gate and the interlevel insulator for increased capacitive coupling between the active gate and the floating gate of the EPROM cell.
Figure 4B:
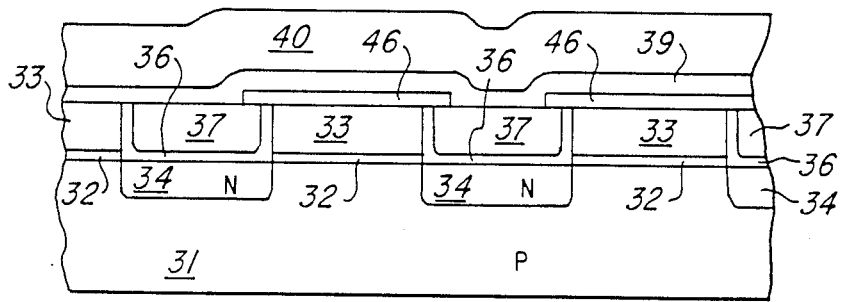

In yet another embodiment of the present invention, polycrystalline silicon "caps" 46, as shown in FIG. 4a, are formed by depositing and patterning a thin polycrystalline layer of the surface of the structure of FIG. 2d. The structure of FIG. 4a is further processed as described with regard to FIG. 2e to form the structure of FIG. 4b. The structure of FIG. 4b provides a greater programming efficiency of increasing the capacitive coupling between word line 40 and floating gates 33. This increased capacitive coupling provides a greater electric field (for the same substrate and active gate voltages) across gate oxide layers 32 than the structure of FIG. 2e. This greater electric field increases the number of electrons injected through gate oxide layers 32 thus increasing programming efficiency.

Figure 5:
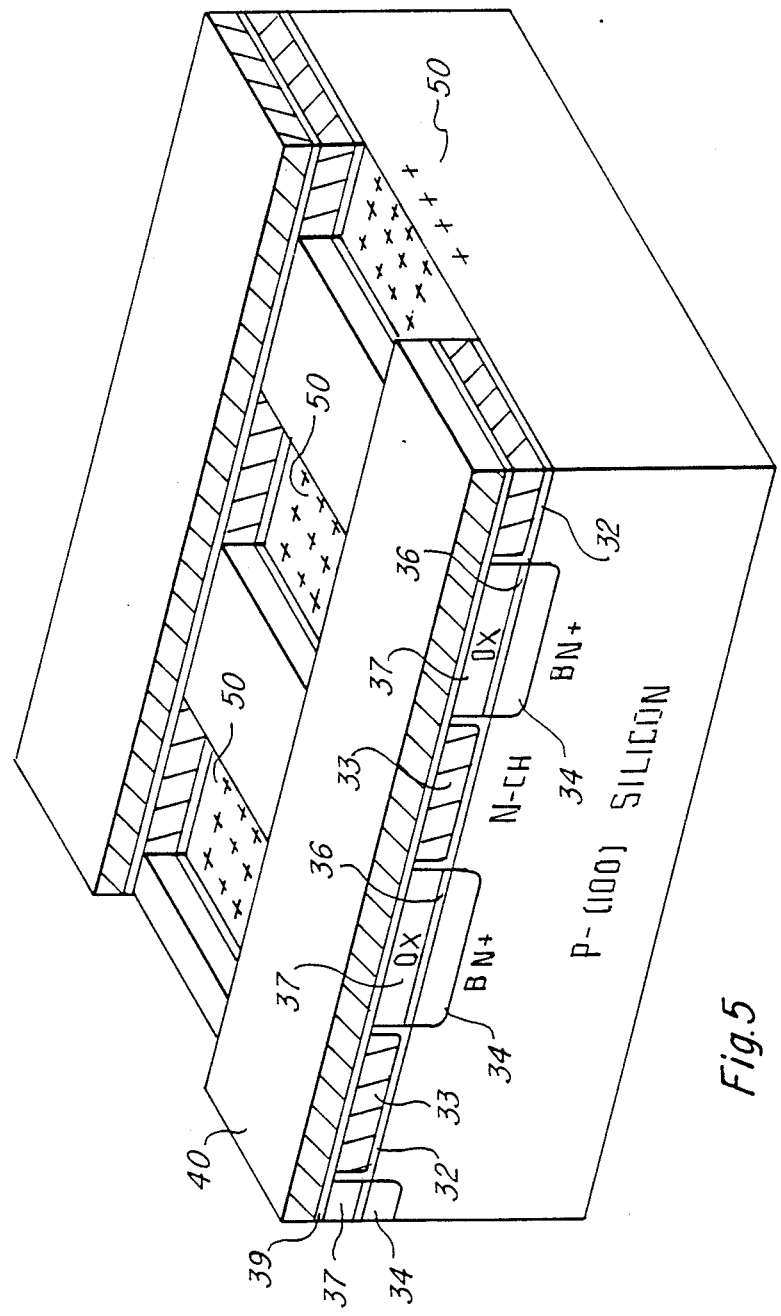
FIG. 5 is an isometric view of an EPROM fabricated using the steps described with regard to FIGS. 2a-2e.

FIG. 5 is an isometric view of an EPROM fabricated using the steps described with regard to FIGS. 2a–2e. FIG. 5 includes bit line isolation regions 50 which are P+ doped regions formed using techniques well known in the art.

Figure 6:
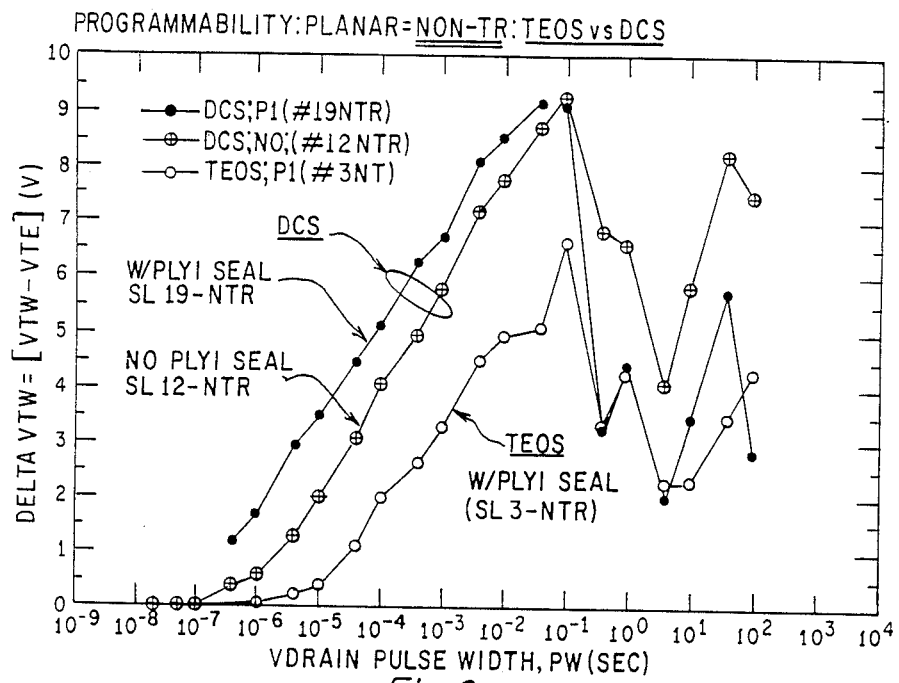
FIG. 6 is a graph illustrating the programmability of the present invention, comparing a sealed floating gate with DCS oxide with non-sealed DCS oxide and non-sealed TEOS oxide.

FIG. 6 shows a graph illustrating the programmability of the present invention, comparing a sealed floating gate structure with DCS oxide with nonsealed structures having DCS oxide and TEOS oxide. As shown, the planar transistor having a deposited DCS oxide and a sealed gate has a higher delta Vtw than the planar transistor with a deposited DCS oxide and no sealed floating gate. Both the sealed and nonsealed DCS planar transistor have superior programmability than the planar transistor with a deposited TEOS oxide and a sealed floating gate. The result of the test data is illustrated in Table 1.

TABLE 1

Non-trench Isolated Planar FAMOS Transistor

| PLANAR OXIDE | FLOATING GATE SEAL | DELTA $V_{tw}$ AT PULSE WIDTH = | | | PERCENT INCREASE IN PROGRAMMABILITY |
|---|---|---|---|---|---|
| | | 10 us | 100 us | 1 ms | |
| DCS | Yes | 3.458 | 5.088 | 6.657 | 105% |
| TEOS | Yes | 0.379 | 1.968 | 3.249 | — |
| DCS | Yes | 3.458 | 5.088 | 6.657 | 16% |
| DCS | No | 1.970 | 4.024 | 5.729 | — |

Figure 7:
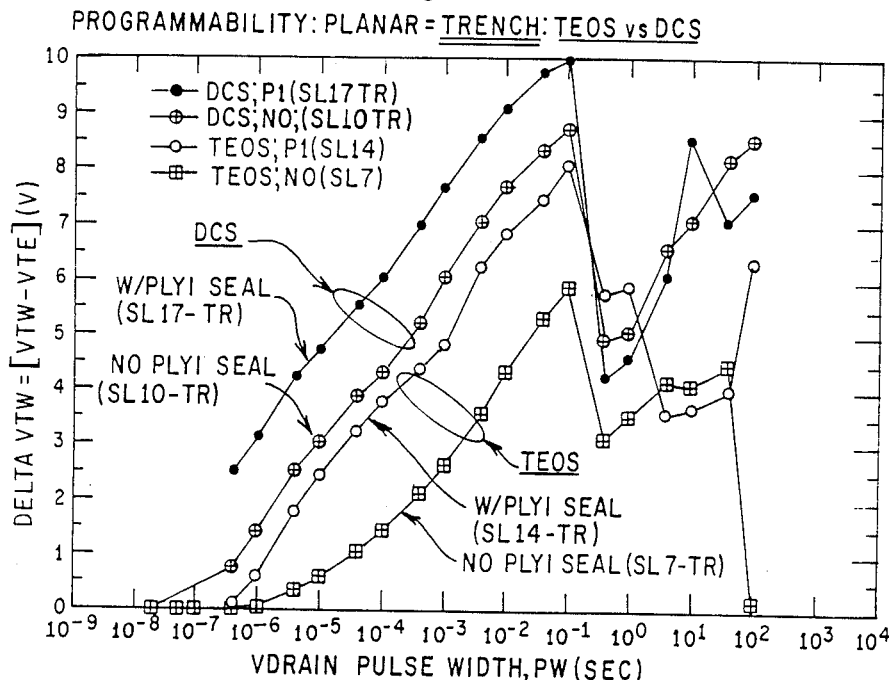
FIG. 7 is a graph illustrating the programmability of the present invention, comparing trench isolated structures having sealed and non-sealed floating gates for DCS oxide and TEOS oxide.

FIG. 7 compares the programmability of trench isolated structures with and without sealed floating gates, for both DCS and TEOS oxides. As shown, the structure with the best programmability is the trench isolated structure with a sealed floating gate and the DCS planar oxide. The next best structure in programmability is the trench isolated structure without a sealed floating gate, and using the DCS oxide. The planar FAMOS transistor with a sealed floating gate and a TEOS oxide has superior programmability over the nonsealed transistor with TEOS oxide. The increase in programmability of various trench and non-trench structures is illustrated in Tables 2 and 3.

TABLE 2

TRENCH ISOLATED PLANAR FAMOS TRANSISTOR

| PLANAR OXIDE | FLOATING GATE SEAL | DELTA $V_{tw}$ AT PULSE WIDTH = | | | PERCENT INCREASE IN PROGRAMMABILITY |
|---|---|---|---|---|---|
| | | 10 us | 100 us | 1 ms | |
| DCS | Yes | 4.719 | 6.016 | 7.648 | 9% |
| DCS | No | 3.189 | 4.458 | 7.029 | |
| TEOS | No | 3.039 | 4.289 | 6.040 | 16% |

TABLE 3

TRENCH vs Non-Trench vs PLY1 seal

| PLANAR OXIDE | FLOATING GATE SEAL | DELTA $V_{tw}$ AT PULSE WIDTH = | | | PERCENT INCREASE IN PROGRAMMABILITY |
|---|---|---|---|---|---|
| | | 10 us | 100 us | 1 ms | |
| DCS | No | 3.189 | 4.458 | 7.029 | 23% |
| DCS | No | 1.970 | 4.024 | 5.729 | |
| DCS | Yes | 4.719 | 6.016 | 7.648 | 15% |
| DCS | Yes | 3.458 | 5.088 | 6.657 | |

Although the sealed gate planar FAMOS transistor 28 has been described in connection with a EPROM memory cell, it should be noted that the invention may be used in connection with EEPROMs, FLASH EEPROMs, EPALs, and other hybrid EPROM devices, such as FAMOS transistors having floating gates which partially cover the channel between the source and drain.

The process of this invention provides a method for manufacturing an EPROM in which a high quality dielectric separates the floating gate from lesser quality dielectrics, thereby increasing the programmability of the device. The techniques for sealing the gate is compatible with previous EPROM processes. The programmability can be further improved by providing trench isolation regions in place of bit line isolation regions 50, as described in co-pending application Ser. No. 122,952, to Esquivel, entitled, "Planar FAMOS Transistor With Trench Isolation Regions", filed Nov. 19, 1987 which is incorporated by reference herein.

Although the present invention has been described in detail, it should be understood that various changes, substitutions and alterations can be made herein without departing from the spirit and scope of the invention as defined by the appended claims.

What is claimed is:

1. A non-volatile memory cell comprising:
   a semiconductor substrate;
   diffused regions formed in said substrate having a channel defined therebetween;
   a first gate region overlying said channel;
   first dielectric regions adjacent said first gate;
   second dielectric regions separating said first gate from said first dielectric regions, said second dielectric regions having superior dielectric qualities than said first dielectric regions; and
   a second gate overlying said first gate.

2. The memory cell of claim 1 wherein said first dielectric regions comprise a deposited oxide.

3. The memory cell of claim 2 wherein said deposited oxide comprises tetraethyl orthosilicate LPCVD oxide.

4. The memory cell of claim 2 wherein deposited oxide comprises dichlorosilane + $N_2O$ LPCVD oxide.

5. The memory cell of claim 1 wherein said second dielectric regions comprise a thermal oxide.

6. The memory cell of claim 1 wherein said second dielectric regions comprise tantalum pentoxide.

7. The memory cell of claim 1 wherein said first gate region overlies a portion of said channel.

8. The memory cell of claim 1 and further comprising a third dielectric layer separating said first gate region from said diffused regions and a fourth dielectric layer separating said first gate region from said second gate.

9. The memory cell of claim 1 wherein said first dielectric regions comprise dielectric regions substantially planar with the first gate region.

10. A method of fabricating a non-volatile memory array in a semiconductor body, comprising the steps of:
- forming a plurality of conductive strips isolated from a substrate by a first insulating layer;
- forming a plurality of bit line diffusions in the semiconductor body;
- forming a thermal oxide on the surface of the semiconductor body and the exposed portions of the conductive strips;
- forming bit line insulators between said conductive strips and overlying said bit line diffusions;
- forming word lines which are not parallel to said bit line diffusions and which are separated from said conductive strips by an insulating layer; and
- removing portions of said conductive strips which do not underlie portions of said word lines.

11. The method of claim 10 wherein said step of forming bit line insulators comprises depositing a dichlorosilane+$N_2O$ oxide.

12. The method of claim 10 wherein said step of forming a thermal oxide comprises forming a tantalum pentoxide layer.

13. A non-volatile memory cell comprising: a semiconductor substrate;
- diffused regions formed in said substrate having a channel defined therebetween;
- a first gate region overlying said channel;
- dichlorosilane oxide regions flanking said first gate;
- a thermal oxide layer separating said first gate from said dichlorosilane oxide regions; and
- a second gate overlying said first gate.

* * * * *